(12) United States Patent
Kadijk et al.

(10) Patent No.: US 8,441,609 B2
(45) Date of Patent: May 14, 2013

(54) LITHOGRAPHIC APPARATUS AND A METHOD OF OPERATING THE LITHOGRAPHIC APPARATUS

(75) Inventors: Edwin Cornelis Kadijk, Eindhoven (NL); Stefan Geerte Kruijswijk, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 632 days.

(21) Appl. No.: 12/488,246

(22) Filed: Jun. 19, 2009

(65) Prior Publication Data

US 2009/0323045 A1 Dec. 31, 2009

Related U.S. Application Data

(60) Provisional application No. 61/129,445, filed on Jun. 26, 2008.

(51) Int. Cl.
*G03B 27/32* (2006.01)
*G03B 27/42* (2006.01)
*G03B 27/52* (2006.01)

(52) U.S. Cl.
USPC .................. 355/30; 355/53; 355/77

(58) Field of Classification Search ......... 310/12.01, 310/12.06; 318/649; 355/30, 53, 72, 77
See application file for complete search history.

(56) References Cited

U.S. PATENT DOCUMENTS

| | | | |
|---|---|---|---|
| 4,509,852 A | 4/1985 | Tabarelli et al. | |
| 7,133,114 B2 | 11/2006 | Hoogendam et al. | |
| 7,433,016 B2 | 10/2008 | Streefkerk et al. | |
| 7,446,853 B2 | 11/2008 | Fukuhara et al. | |
| 7,468,779 B2 | 12/2008 | De Graaf et al. | |
| 2004/0136494 A1 | 7/2004 | Lof et al. | |
| 2004/0207824 A1 | 10/2004 | Lof et al. | |
| 2005/0221234 A1* | 10/2005 | Ito | 430/322 |
| 2006/0038968 A1 | 2/2006 | Kemper et al. | |
| 2006/0119809 A1 | 6/2006 | Verhagen et al. | |
| 2006/0158627 A1 | 7/2006 | Kemper et al. | |
| 2006/0250590 A1 | 11/2006 | Streefkerk et al. | |

(Continued)

FOREIGN PATENT DOCUMENTS

| | | |
|---|---|---|
| EP | 1420299 A2 | 5/2004 |
| EP | 1420300 A2 | 5/2004 |

(Continued)

OTHER PUBLICATIONS

Japanese Office Action mailed Aug. 1, 2011 in corresponding Japanese Patent Application No. 2009-145234.

*Primary Examiner* — Hung Henry Nguyen
*Assistant Examiner* — Colin Kreutzer
(74) *Attorney, Agent, or Firm* — Pillsbury Winthrop Shaw Pittman LLP

(57) ABSTRACT

A lithographic projection apparatus is disclosed that includes a substrate table, a positioner, a projection system and a fluid handling system. The substrate table is constructed and arranged to hold a substrate, the substrate having an edge feature. The projection system is configured to project a patterned beam of radiation onto the substrate. The fluid handling system is constructed and arranged to supply a liquid flow to a space between the projection system and the substrate table and to at least partly confine the liquid to the space. The positioner is configured to position the substrate on the substrate table so that the edge feature lies downstream of the substrate in the liquid flow.

19 Claims, 8 Drawing Sheets

U.S. PATENT DOCUMENTS

2007/0159615 A1* 7/2007 Horiuchi .................. 355/72
2007/0216881 A1 9/2007 Van Der Schoot et al.

FOREIGN PATENT DOCUMENTS

| | | |
|---|---|---|
| JP | 2006-019623 | 1/2006 |
| JP | 2006-114765 | 4/2006 |
| JP | 2007-013150 | 1/2007 |
| JP | 2007-207887 | 8/2007 |
| JP | 2008-085370 | 4/2008 |
| WO | 99/49504 A1 | 9/1999 |
| WO | 2005/064405 A2 | 7/2005 |

* cited by examiner

LITHOGRAPHIC APPARATUS AND A METHOD OF OPERATING THE LITHOGRAPHIC APPARATUS

This application claims priority and benefit under 35 U.S.C. §119(e) to U.S. Provisional Patent Application No. 61/129,445, entitled "A Lithographic Apparatus and a Method of Operating the Lithographic Apparatus", filed on Jun. 26, 2008. The content of that application is incorporated herein in its entirety by reference.

FIELD

The present invention relates to a lithographic apparatus and a method for operating the lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic e.g. Decalin, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system substantially the whole top surface of the substrate is covered in liquid. This may be advantageous because then the substantially whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006-0119809 in which a member is provided which covers the substrate W in all positions and which is arranged to have immersion liquid extending between it and the top surface of the substrate and/or substrate table which holds the substrate.

A significant cause of defects in devices manufactured using immersion lithographic apparatus can be bubbles present in the immersion liquid. The presence of a bubble in the immersion liquid can cause dose variations and image distortions, depending on the size and location of the bubble. It is therefore highly desirable to prevent bubbles entering the path of the beam of radiation projected onto the substrate. Major sources of bubbles can be gaps in the smooth top surface of the substrate table (the mirror block), for example, around sensor units, fiducial plates and the substrate. As such a gap passes with respect to the liquid supply system (liquid confinement structure) it may not fill completely and the gas left behind may form a bubble. The bubble may then rise out of the gap and into the space between the projection system and the substrate. A fluid extraction device may remove liquid, gas or both from the gap. In addition the device may remove bubbles that may be retained in the gap by a bubble retaining device. Consequently, as described in United States patent application publication no. US 2006-0250590, bubbles formed in the liquid may be prevented from causing imaging defects during the production of devices.

SUMMARY

One bubble source in the gap is in the region of an indentation formed in the edge of a substrate. The indentation is used for consistent and accurate orientation of the substrate during processing. In an immersion system, the edge of the substrate may affect fluid flow, especially flow of immersion liquid. As a typical substrate is substantially circular in shape, the fluid flow is substantially the same all around the edge of the substrate, except at the indentation. There, because of the different shape of the edge, the indentation may entrap a bubble. The bubble may escape from the indentation to cause imaging defects.

It is desirable, for example, to provide a lithographic apparatus in which the risk of bubble formation at an indentation is reduced and desirably substantially minimized. It is desirable that such a source of bubbles is reduced or suppressed so as to reduce further the image defects caused during device production.

According to an aspect of the invention, there is provided a lithographic projection apparatus, comprising: a substrate table, a positioner, a projection system and a fluid handling system. The substrate table may be constructed and arranged to hold a substrate, the substrate having an edge feature. The projection system may be configured to project a patterned beam of radiation onto the substrate. The fluid handling system may be constructed and arranged to supply a liquid flow to a space between the projection system and the substrate table and to at least partly confine the liquid to the space. The positioner may be configured to position the substrate on the substrate table so that the edge feature lies downstream of the substrate in the liquid flow.

According to an aspect of the invention, there is provided a method of operating a lithographic projection apparatus, the substrate having an edge feature, the method comprising: positioning a substrate on a substrate table and providing a flow of immersion liquid on the surface of the substrate, wherein the edge feature is downstream of the substrate in the immersion liquid flow.

According to an aspect of the invention, there is provided an immersion lithographic projection apparatus, comprising: a substrate table, a fluid handling system and a positioner. The substrate table may be configured to hold a substrate, the substrate having a positioning feature. The fluid handling system may be configured to supply an immersion liquid flow on the substrate table. The positioner may be configured to position the substrate on the substrate table so that, in use of the apparatus, the positioning feature is downstream in the immersion liquid flow relative to the substrate.

According to an aspect of the invention, there is provided a method of operating a lithographic apparatus, the method comprising: positioning a substrate having a positioning feature on a substrate table so that in an immersion liquid flow the positioning feature is downstream in the flow relative to the substrate and providing the flow of the immersion liquid on the surface of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
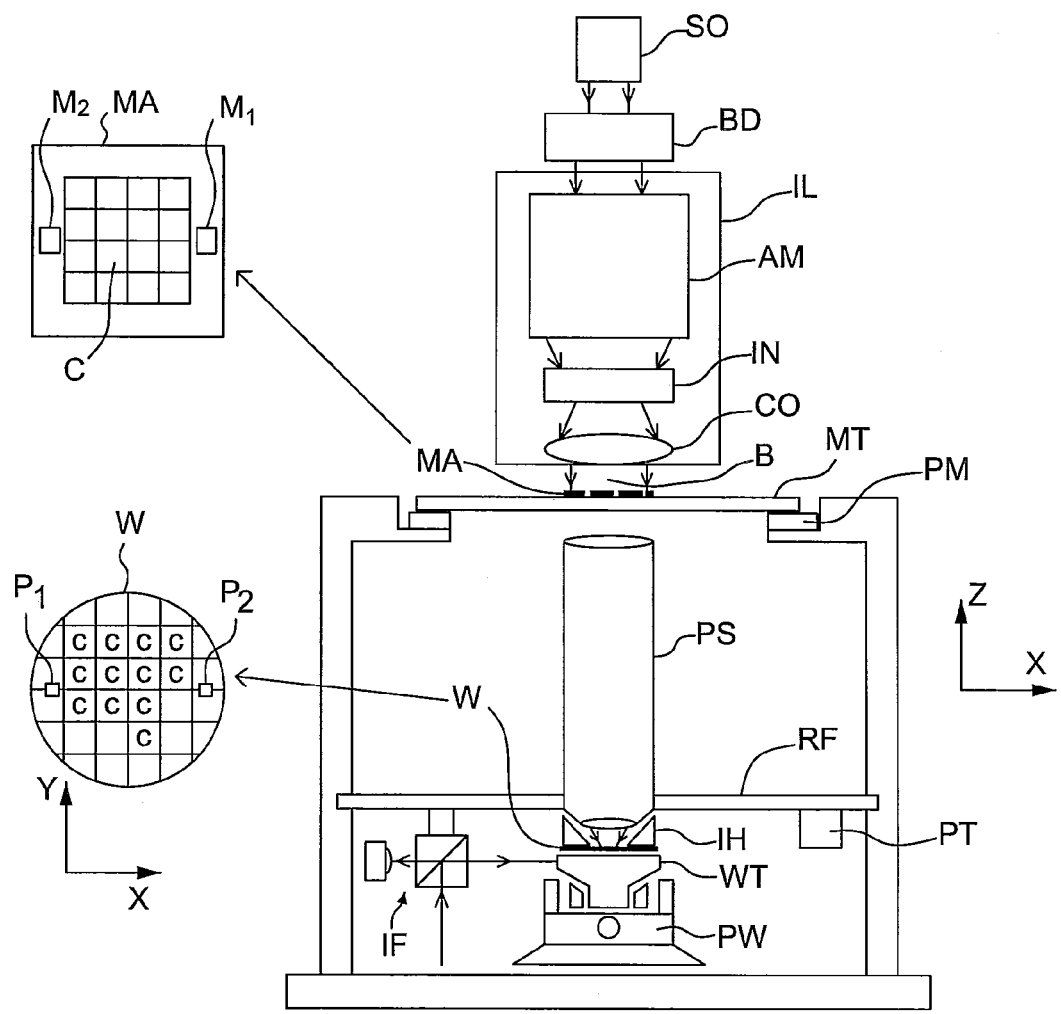
FIG. 1 depicts a lithographic apparatus according to an embodiment of the invention.
Figure 1A:
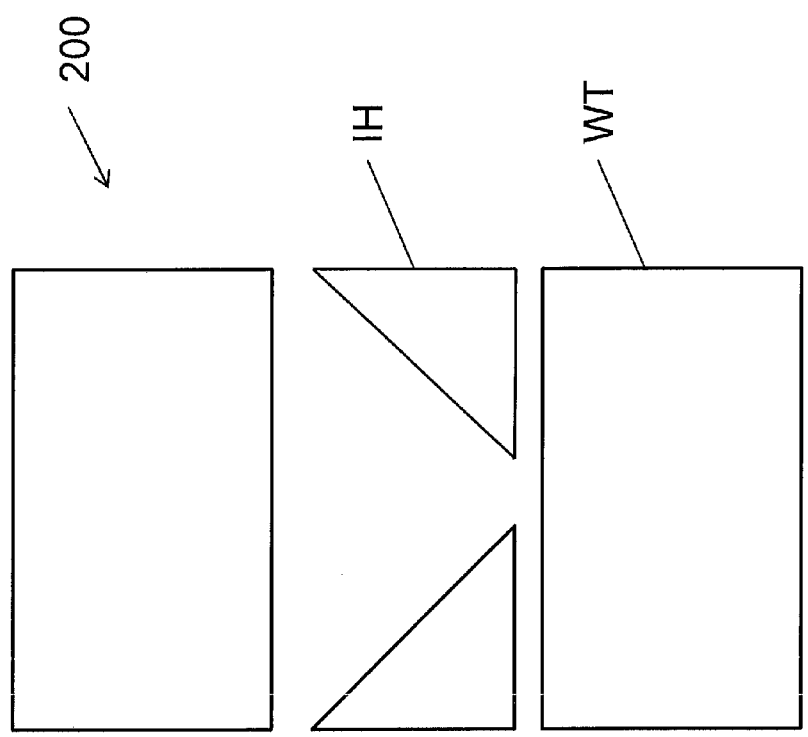
FIG. 1A depicts a metrology tool or metrology device according to an embodiment.
Figure 2:
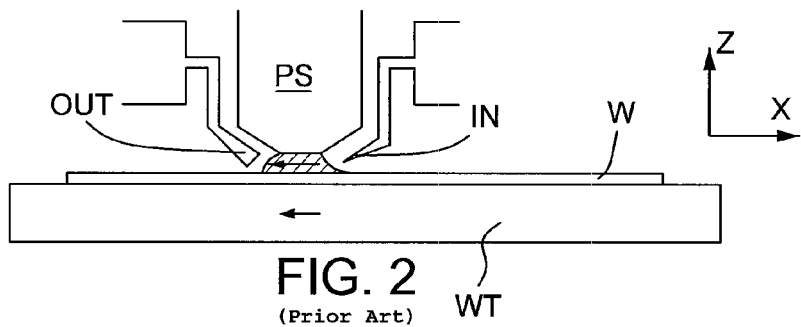
FIGS. 2 and 3 depict a liquid supply system used in a prior art lithographic projection apparatus.
Figure 3:
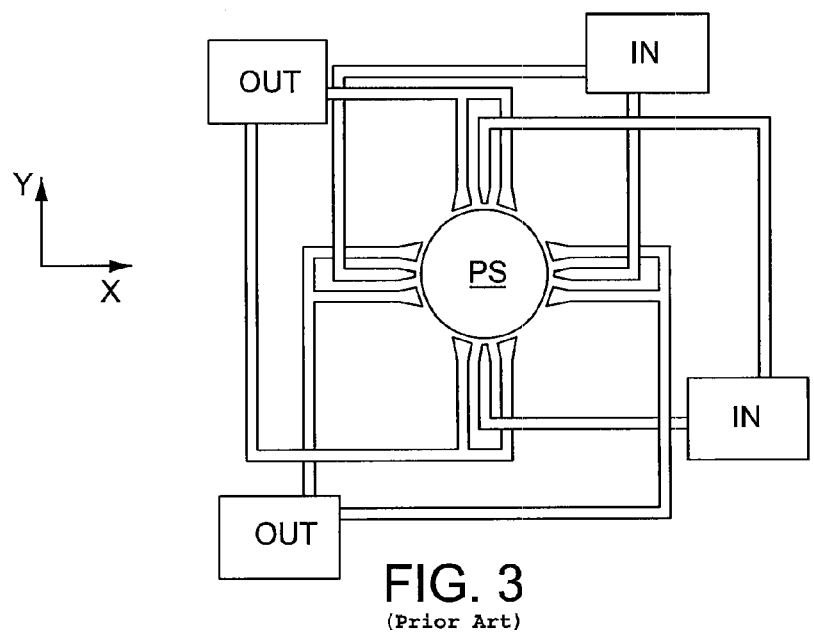
Figure 4:
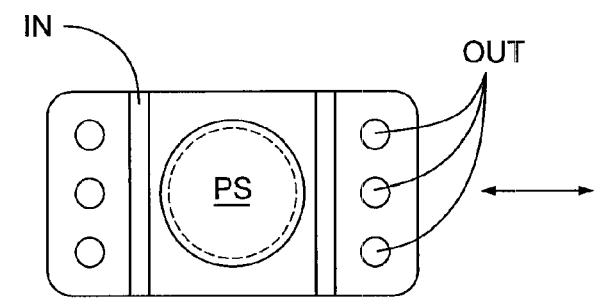
FIG. 4 depicts a liquid supply system according to another prior art lithographic projection apparatus.
Figure 4:
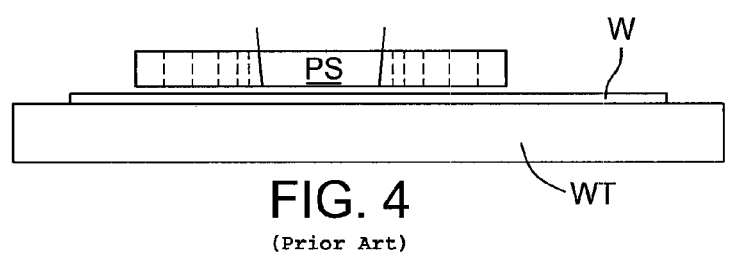

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement for providing liquid between a final element of the projection system PS and the substrate is the so called localized immersion system. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

Figure 5:
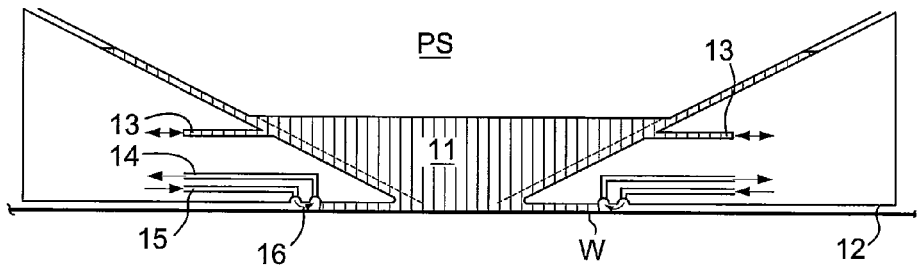
FIG. 5 depicts, in cross-section, a barrier member which may be used in an embodiment of the present invention as a liquid supply system.

Another arrangement which has been proposed is to provide the liquid supply system with a barrier member which extends along at least a part of a boundary of the space between the final element of the projection system and the substrate table. Such an arrangement is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal. Such a system is disclosed in United States patent application publication no. US 2004-0207824.

FIG. 5 schematically depicts a localized liquid supply system or liquid handling structure with a barrier member 12, IH. The barrier member 12, IH extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the barrier member 12 positioned below and surrounding the final element of the projection system PS. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication No. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. Relative movement of that part of the liquid supply system and the substrate W may lead to breakdown of the seal and thereby leaking of liquid. The problem is more significant at high scan velocities. An increased scan velocity is desirable because throughput increases.

Figure 6:
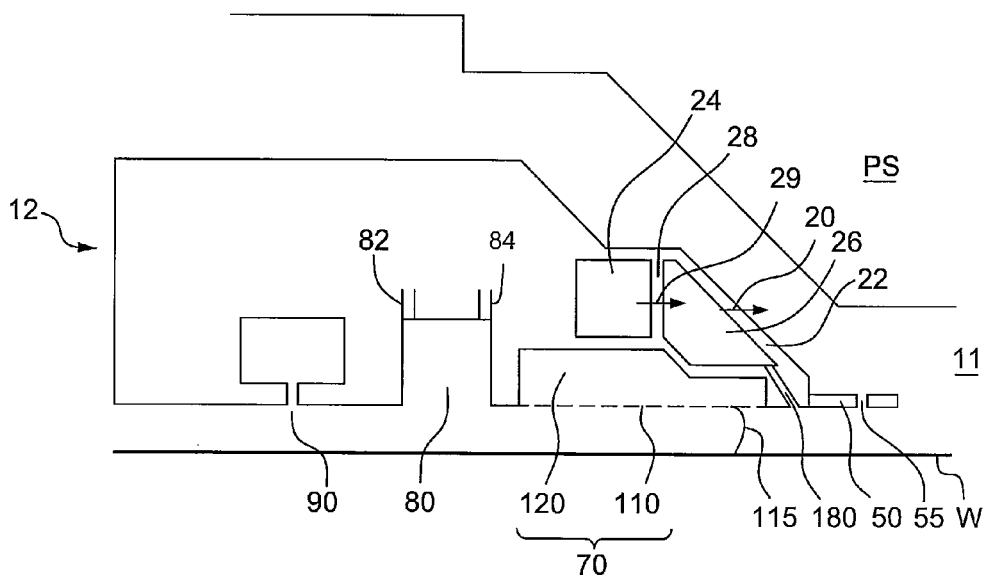
FIG. 6 illustrates, in cross-section, another barrier member which may be used in an embodiment of the present invention.

FIG. 6 illustrates a barrier member 12 which is part of a liquid supply system. The barrier member 12 extends around the periphery of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier member could be other shapes so long as it has an opening through which a beam may pass out from the final element of the projection system PS. The opening may be centrally located. Thus during exposure the beam may pass through liquid contained in the opening of the barrier member and onto the substrate W. The barrier member 12 may be, for example, substantially rectangular and is not necessarily the same shape as the final element of the projection system PS is at the height of the barrier member 12.

The function of the barrier member 12 is at least partly to maintain or confine liquid in the space between the projection system PS and the substrate W so that the projection beam may pass through the liquid. The top level of liquid is simply contained by the presence of the barrier member 12 and the level of liquid in the space is maintained such that the liquid does not overflow over the top of the barrier member 12.

The immersion liquid is provided to the space 11 by the barrier member 12. A passageway or flow path for immersion liquid passes through the barrier member 12. Part of the flow path is comprised by a chamber 26. The chamber 26 has two side walls 28, 22. A liquid flow 29 passes from a chamber 24 through the first side wall 28 into chamber 26 and then through the second side wall 22 into the space 11. A plurality of outlets 20 provide the liquid to the space 11.

A seal is provided between the bottom of the barrier member 12 and the substrate W. In FIG. 6 a seal device is configured to provide a contactless seal and is made up of several components. Radially outward from the optical axis of the projection system PS, there is provided a (optional) flow plate 50 which extends into the space (though not into the path of the projection beam) which helps maintain substantially parallel flow of the immersion liquid out of outlet 20 across the space. The flow control plate 50 has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an inlet 180. The inlet 180 can provide liquid in a direction towards the substrate. During imaging this may be useful in preventing bubble formation in the immersion liquid by filling a gap between the substrate W and substrate table WT with liquid.

Radially outwardly of the inlet 180 may be an extractor assembly 70 to extract liquid from between the barrier member 12 and the substrate W and/or the substrate table WT. The extractor 70 will be described in more detail below and forms part of the contactless seal which is created between the barrier member 12 and the substrate W. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. Radially outwardly of the recess 80 may be a gas knife 90. An arrangement of the extractor, recess and gas knife is disclosed in detail in United States patent application publication no. US 2006-0158627.

The extractor assembly 70 comprises a liquid removal device or extractor or inlet such as the one disclosed in United States patent application publication no. US 2006-0038968. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 70. However, when the porous surface 110 comes into contact with liquid there is no meniscus to restrict flow and the liquid can flow freely into the chamber 120 of the liquid removal device 70. The porous surface 110 extends radially inwardly along the barrier member 12 (as well as around the space). The rate of extraction through the porous surface 110 varies according to how much of the porous material 110 is covered by liquid.

The porous material 110 has a large number of small holes, e.g. of diameter $d_{hole}$ in the range of 5 to 50 μm, and is maintained at a height in the range of 50 to 300 μm above a surface from which liquid is to be removed, e.g. the surface of a substrate W. In an embodiment, porous material 110 is at least slightly hydrophilic, i.e. having a contact angle of less than 90° to the immersion liquid, e.g. water.

It may not always be possible to prevent gas being drawn into the liquid removal device but the porous material 110 will prevent large uneven flows that may cause vibration. Microsieves made by electroforming, photoetching and/or laser cutting can be used as the porous material 110. Suitable sieves are made by Stork Veco B. V., of Eerbeek, the Netherlands. Other porous plates or solid blocks of porous material may also be used, provided the pore size is suitable to maintain a meniscus with the pressure differential that will be experienced in use.

During scanning of the substrate W (during which the substrate moves under the barrier member 12 and projection system PS) the meniscus 115 extending between the substrate W and the barrier member 12 can be drawn either towards or away from the optical axis by a drag force applied by the moving substrate. This can lead to liquid loss which may result in: evaporation of the liquid, cooling of the substrate, and consequent shrinkage and overlay errors as described above. Liquid stains may also or alternatively be left behind from interaction between the liquid droplets and resist photochemistry.

Although not specifically illustrated in FIG. 6, the liquid supply system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery of the barrier member 12 during movement of the barrier member 12 relative to the projection system PS. In an alternative or additional arrangement, liquid may be removed from the top of the barrier member 12 using, for example, an extractor such as a single phase extractor similar to the extractor 70. An alternative or additional feature is a liquidphobic or hydrophobic coating. The coating may form a band around the top of the barrier member 12 surrounding the opening and/or around the last optical element. The coating may be radially outward of the optical axis of the projection system. The liquidphobic or hydrophobic coating helps keep the immersion liquid in the space.

In an apparatus in which two substrate tables or stages are provided in which each one carries a substrate, there exists a difficulty during swap of one substrate from underneath the projection system to another substrate table underneath the projection system. This is because if the liquid from the liquid supply system is removed prior to swapping the tables then drying stains can appear on the final element of the projection system. One solution to this problem which has been proposed is to provide a dummy substrate which is positionable under the projection system during swapping of substrate tables. In this way the liquid supply system can be kept on during swap of substrates and drying stains are prevented. Such a dummy substrate is described, for example, in European patent application publication no. EP-1,420,299. An alternative to this system is to bring the second substrate table close to the first substrate table and to move the two substrate tables simultaneously under the projection system. If the gap between the two substrate tables is small (or at least has a drain underneath it) liquid loss should be minimized. In some instances the substrate table WT has its top surface extended by a protrusion which may be rotatable or retractable, as in the form of a drawbridge. Such an arrangement is disclosed in United States patent application publication no. US 2007-0216881.

In a lithographic apparatus, the substrate W is commonly placed upon a substrate holder, also referred to as a pimple plate or burl table. The substrate holder sits in or forms a recess in the upper surface of the substrate table WT. The depth of the recess and the height of the substrate holder are dimensioned so that the upper surface of the substrate is substantially co-planar with the upper surface of the substrate table WT. To accommodate variations in the size and placement of the substrate W (within certain tolerances) the area of the recess in the plane of the substrate table WT is slightly larger than the area of a side of a substrate W. So a gap will remain around the edge of a substrate placed in the recess.

Figure 7:
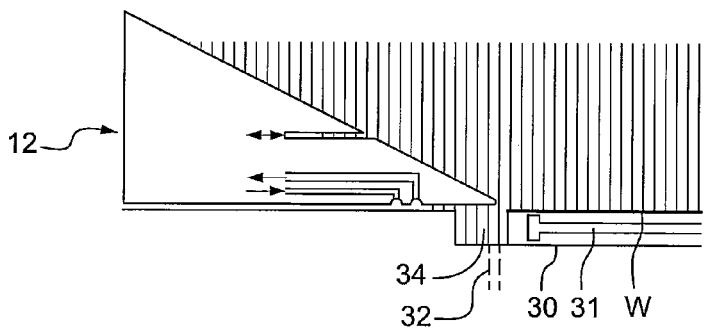
FIG. 7 is schematic cross-section of a gap between a substrate and substrate table.

The gap, which is shown in FIG. 7, may be a significant source of bubbles that may enter the beam path and affect imaging. During movement of the substrate table relative to the projection system the gaps passes under the projection system at a speed at which there is often insufficient time for the gap to completely fill with immersion liquid from the immersion space 11. Gas that may remain in the gap forms a bubble in the immersion liquid. The bubble can leave the gap and float up into the path of a beam of radiation, for example during exposure. There, the bubble can cause imaging defects such as dose variation and image distortion.

Various measures may be may be made to reduce the formation of bubbles, for example as disclosed in United States patent application publication no. US 2006-0250590. The gap 34 between the substrate holder 31 and the recess 30 in which the substrate W and substrate holder 31 are placed, may be provided with various features to reduce the number of bubbles. Suitable features to help prevent bubble formation in the gap include: a hydrophilic coating to keep liquid out of the gap and prevent bubble formation; a hydrophobic feature such as a coating; a plurality of hairs, or a plurality of points or edges which may act to retain bubbles in the gap; a fluid (liquid, gas or both) extractor to ensure a fluid flow may remove any bubbles that may be in gap 34 before they rise into the path of a beam of radiation; a liquid supply, to ensure the gap is pre-filled so as to help prevent the formation of bubbles; or a combination of these features.

Figure 8A:
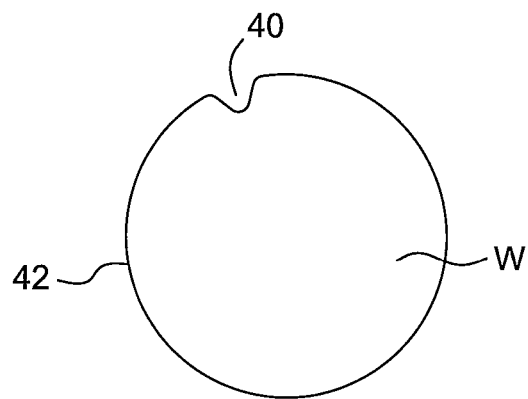
FIGS. 8a and 8b illustrate substrates with different types of indentation.
Figure 8B:
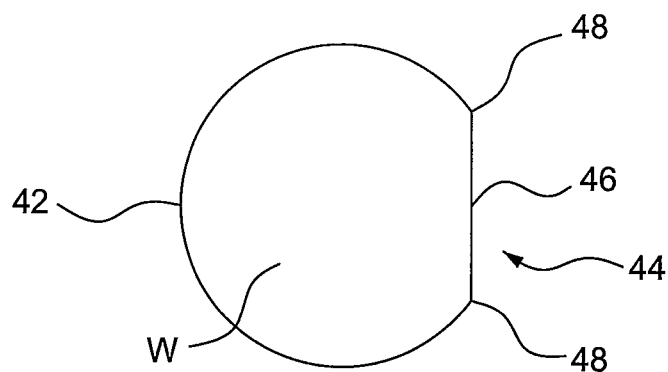

An embodiment of the present invention addresses a specific bubble source in the gap. The edge(s) of substrates typically have an indentation. In a substrate W, the indentation may be a notch 40 formed in a main edge 42 of the substrate as shown in FIG. 8a, which may have a curved edge. The notch 40 may be small relative to size of the substrate W. For a 300 mm substrate, the notch may be less than 5 mm, desirably in the range of 2 to 4 mm. In another substrate W (which may not be 300 mm in diameter), the indentation 44 may be larger, as shown in FIG. 8b, than the notch 42 shown in FIG. 8a. The edge 46 of the indentation 44 may be substantially straight. The edge may interconnect the main edge at two corners 48. The length of the edge may be less than 60 mm, more than 5 mm and may be in one of the ranges (provided in a non-limiting list): 5 to 10 mm, 10 to 15 mm, 13 to 17 mm, 15 to 20 mm, 20 to 25 mm, 30 to 35 mm, 40 to 45 mm, 45 to 50 mm, and 55 to 60 mm. A purpose of the indentation 40, 44 is to facilitate orientation of the substrate during processing, for example for a substrate positioner PT, as shown in FIG. 1, when placing or removing a substrate W from a substrate table WT.

The features formed on the substrate W during processing are created through several steps. The processing may form several layers on the substrate W, so that a feature may comprise of more than one layer. It is important that different layers of a feature are correctly aligned with each other, for example during exposure, so accurate, consistent orientation of the substrate W is desirable.

An accurate consistent orientation of the substrate (as indicated by the edge feature, i.e. the indentation 40, 44) relative to the exposed image may be desirable for correct orientation during process steps other than the exposure step. This may help ensure that the different layers are correctly positioned and orientated with respect to each other. Such steps are generally performed in the track and may include (in a non-limiting way): cutting of the substrate by a cutter, measurement of the substrate by a metrology tool, application of a resist and/or developer using a coater and drying of the substrate using a dryer. If the substrate is not correctly orientated for the cutter, there is a risk that the substrate is not cut between devices formed on the substrate, but across features of a formed device. For the metrology tool, correct substrate orientation is desirable so that the intended markers may be detected and located to facilitate measurement processes and recipes. This may help to ensure consecutive layers are properly aligned with respect to each other. Generally incorrect orientation could prevent successful device manufacture and function. It is therefore general practice to have the alignment of the substrate during an exposure step (i.e. in a lithographic apparatus) consistent with all the other tools used in the device manufacturing process, e.g. the track.

Figure 9:
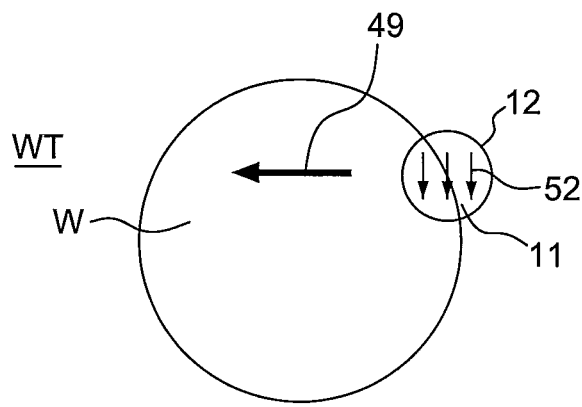
FIG. 9 is a schematic representation of an immersion system in which the immersion liquid flows substantially perpendicularly to the direction of relative motion between a projection system and a substrate table.

During processing in an immersion system, such as a localized immersion system as described above, an immersion liquid flow is provided to space 11 by structure 12. In an embodiment, the direction of flow is parallel to the relative direction of motion between the substrate table WT and the barrier member 12 (which forms part of a fluid handling structure). In an embodiment, the immersion liquid flow is perpendicular to the relative motion between the substrate table and barrier member, for example during scanning, see U.S. Pat. No. 7,133,114. In such an embodiment, the flow of immersion liquid may be substantially tangential or parallel to a major edge of the indentation, as shown in FIG. 9. In FIG. 9, the direction of movement of the substrate table WT relative to confinement structure 12 is shown by arrow 49. The flow direction of the immersion liquid in the space 11 of the confinement structure 12 is shown as arrows 52. This arrangement may be desirable for thermal and defectivity reasons. However, the relative directions may be at any angle. The relative motions may change during operation, for example when changing from scanning to stepping (and vice versa) while changing scanning direction.

The liquid flow may entrap a bubble as it flows over at least a part of the indentation 40, 44. The liquid flow is removed from the space 11 by an outlet in the barrier member 12. The bubble may be extracted in the liquid flow through, for example, the outlet 13, 14 or the extractor 70. In an embodiment there is a fluid extraction system 32 in the gap 34, which extracts gas from the gap 34. However, in some circumstances the bubble is extracted through neither the fluid extraction system 32 nor the outlet 13, 14/extractor 70. The bubble may escape from the indentation 40, 44 and enter the immersion space 11. The bubble may be a source of defects. Therefore there may be a risk that bubbles may enter the immersion space using a standard substrate orientation, which is consistent with the orientation of the substrate in other tools used in a device manufacturing method (e.g. the track).

Figure 10:
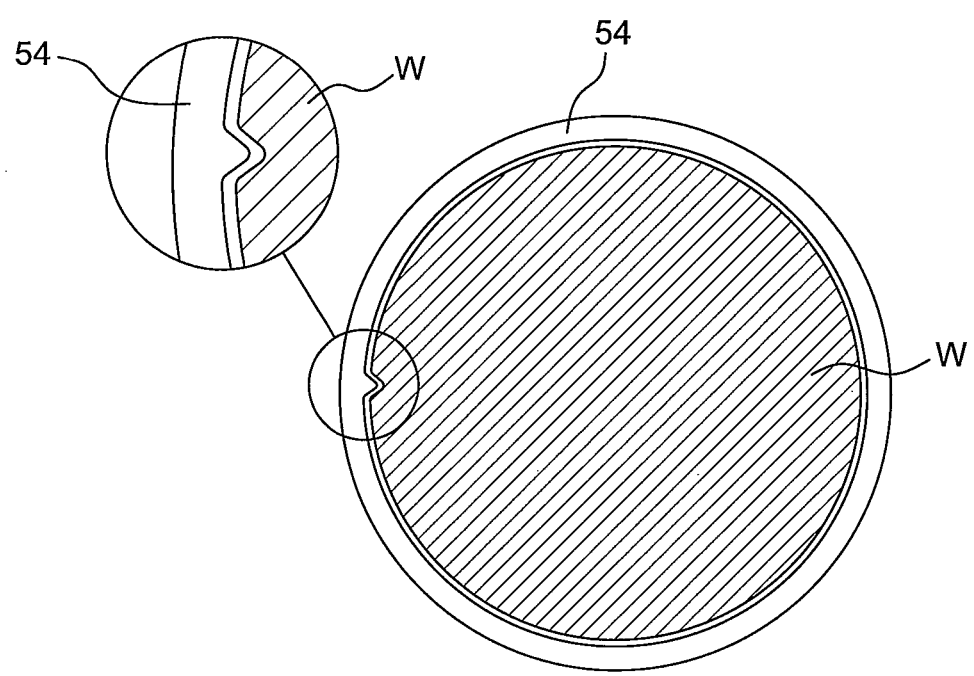
FIG. 10 is a schematic representation of a cover ring to at least partly fill a substrate indentation.

It may be possible to reduce the risk of bubble formation in this way by filling the indentation 40, 44. In an embodiment, a substrate table cover ring 54 may be fitted to the substrate W, as shown in FIG. 10. The cover ring 54 may be an integral part of the substrate table WT or be separate piece placed on the substrate table WT. The cover ring 54 has a geometry in the region of the indentation at the notch position that helps fill at least in part the indentation. The geometry helps ensure that the gap between the edge of the substrate W and cover ring 54 is constant around the periphery of the substrate W. In this arrangement, the gap 34 between the substrate table WT and the substrate W has substantially the same width all around the edge of the substrate W. The constant width of the gap 34 helps ensure that there is insufficient space for a significant risk of a bubble 56 (see FIG. 11) developing at the indentation 40, 44. A different cover ring 54 may be required to process a substrate W having a different shaped indentation 40, 44 unless the geometry of the cover ring 54 is adjustable, for example, using an actuator to change the shape of the cover ring 54 geometry. In addition, the position of the cover ring 54 may require the substrate W to be placed in the same orientation relative to the substrate table WT. So for this arrangement it may not be possible during exposure to have a different orientation of the substrate with respect to the substrate table because the cover ring 54 has a fixed position with respect to the substrate table WT. However, a separable cover ring 54 may be placed at different orientations on the substrate table WT and/or the substrate table WT may be configured to change the orientation, e.g., rotate the cover ring 54, to align the geometry of the cover ring 54 at different locations on the substrate table WT.

In an embodiment of the present invention, the substrate W is positioned on the substrate holder 31 so that the indentation 40, 44 is positioned downstream in the immersion liquid flow 52 relative to the substrate W. The indentation 40, 44 may be considered to be positioned downstream where a bubble which may form in the indentation can not enter the space 11 and interfere with the exposure of a target area. That is in an embodiment, all, or a majority, of the substrate is upstream in the immersion liquid flow 52 relative to the indentation 40, 44. Where the substrate orientation is changed, the direction of flow of the immersion liquid may be changed. An embodiment of the present invention may require a substrate orientation that is different to standard substrate orientations. A standard orientation is generally selected for consistency with respect the desired orientation for other process steps, not the direction of immersion liquid flow with respect to the selected substrate orientation. Thus, implementation of an embodiment of the present invention in an immersion lithographic apparatus may require the adaptation of other tools in the device manufacturing method. In each of these tools, it may be desirable to have the substrate orientation consistent with the orientation in the lithographic apparatus according to an embodiment of the present invention.

Figure 11A:
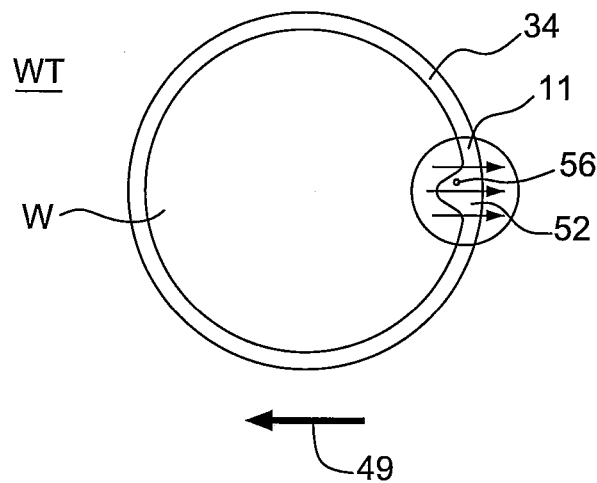
FIGS. 11a to 11c are schematic representations of different embodiments of the present invention in which the indentation in a substrate is located downstream of the substrate in the liquid flow.
Figure 11B:
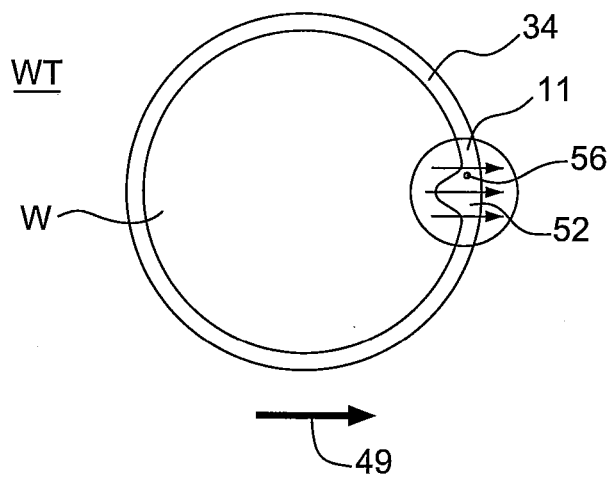
Figure 11C:
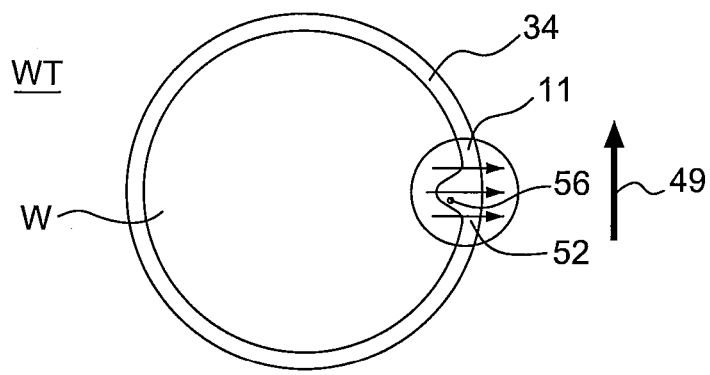

An embodiment is shown in FIG. 11a which exemplifies the relative directions of the movement of the substrate table WT and the barrier member 12 for a system in which the immersion liquid flow 52 is substantially parallel to the relative direction of movement 49 between the projection system PS and the substrate table WT (e.g. a scanning direction). In this embodiment the liquid flow 52 is with the relative movement 49 of the substrate table WT. FIG. 11b shows an embodiment of the invention in which the immersion liquid flow 52 is substantially parallel, but in an opposite direction, to the relative motion 49 of the substrate table WT. FIG. 11c shows an embodiment of the invention in which the immersion liquid flow 52 is substantially perpendicular to the relative motion 49 between the projection system PS and the substrate table WT (e.g., a stepping motion). In each of these embodiments, a bubble 56 formed in the indentation 40, 44 is entrained in the immersion liquid flow 52 and substantially away from the substrate.

The indentation 40, 44 is downstream of the substrate W in the flow of the immersion liquid 52. The bubble 56 may rise from the indentation 40, 44 and as it does, it rises into the liquid flow 52. As the liquid flows, the bubble 56 becomes entrained in the liquid flow 52. The liquid flow 52 is removed from the immersion space 11 through an outlet 13, 14 or 70 as described above. In an embodiment, the liquid could be removed using the fluid extraction system 32 located in the gap 34. So the bubble 56 is removed as well. An embodiment of the invention may help to prevent a bubble from rising up from a part of the gap near the indentation 40, 44 into the immersion space 11.

Figure 12:
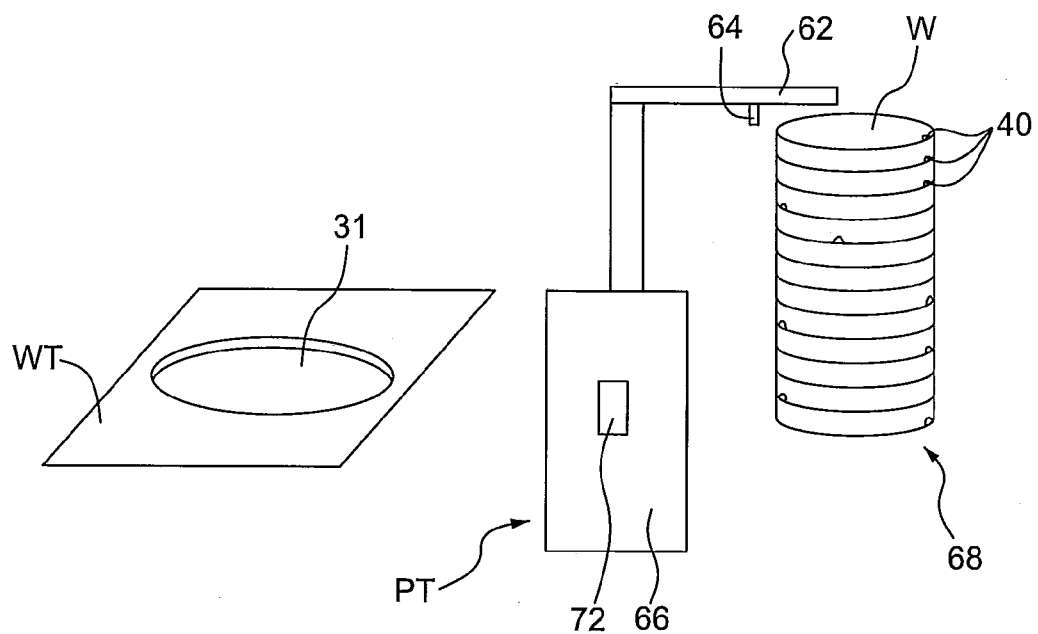
FIG. 12 is a schematic representation of a substrate handler for use in an embodiment of the present invention.

In an embodiment, the substrate positioner PT may comprise a substrate handler 62, an indentation sensor 64 and a controller 66 as shown in FIG. 12. The substrate handler 62 moves a substrate W from a substrate stack 68 to the substrate holder 31. The substrate handler 62 removes the substrate W from the substrate holder 31. The indentation sensor 64 senses the location of the indentation 40, 44 in the edge 42 of the substrate W. The indentation sensor 64 may be provided with the substrate handler 62. The indentation sensor 64 may operate when the substrate handler 62 takes a substrate W from the substrate stack 68.

In an embodiment, when the substrate handler 62 takes a substrate W from the substrate stack 68, the sensor 62 detects the location of the indentation 40, 44. The sensor 62 may be connected to the controller 66. The controller 66 may receive a signal from the sensor 62. The signal is indicative of the location of the indentation 40, 44. The controller 66 is connected to the substrate handler 62. The substrate handler 62 may be configured to rotate the substrate W. The controller 66 comprises a memory 72 on which is stored the route of the substrate table WT as it moves relative to the projection system PS during scanning.

Using the information of the route and the location of the indentation 40, 44, the controller 66 may determine (or calculate) the required rotation of the substrate W. The required rotation is the angular displacement of the substrate W that would ensure that the indentation 40, 44 is positioned downstream of the substrate W in the flow of immersion liquid 52. The size of the required rotation is transmitted in a signal to the substrate handler 62 from the controller 66. The substrate handler 62 rotates the substrate W by the required rotation. The rotation of the substrate W may be a pre-alignment step so that rotation is not required as the substrate W is placed onto the substrate table WT, or the once the substrate W is placed on the substrate table WT. The substrate handler 62 places the substrate W in position on the substrate table WT.

The above description of the positioner PT arrangement is an embodiment. The positioner PT may comprise a rotator separate from the substrate handler 62. In an embodiment, the sensor 64 may locate the position of the edge feature 40 in the edge of a substrate W. The sensor 64 may sense the edge feature of one or more substrates W in the stack 68, for example the whole stack 68. The rotator may then rotate a substrate W. The substrate W may be rotated in the stack 68 or once the substrate W has been removed from the stack 68. The rotator may rotate one or more substrates W in the stack 68, for example all the substrates W in the stack 68, before the substrates W are transferred (in turn) to the substrate table WT. Such a rotator may rotate each substrate W to pre-align the substrate W with respect to its edge feature 40, after the edge feature has been sensed, or after two or more substrates have been sensed (for example all the substrates in the stack). The substrate handler 62 may then transfer the pre-aligned substrate from the rotator or the stack 68 to the substrate table WT. The sensor 64, the rotator and the substrate handler 62 may be separate or be present in any combination. In an embodiment, the sensor 64 and the rotator might be part of, or connected to, the stack 68.

A positioner PT as described may be present in one or more of the tools used in the track. This may help to enable the substrate W to be orientated consistently with the substrate orientation in the lithographic apparatus. Note that the substrates may not be supplied in a stack, but may be supplied consecutively or in groups, i.e. batches.

Figure 13:
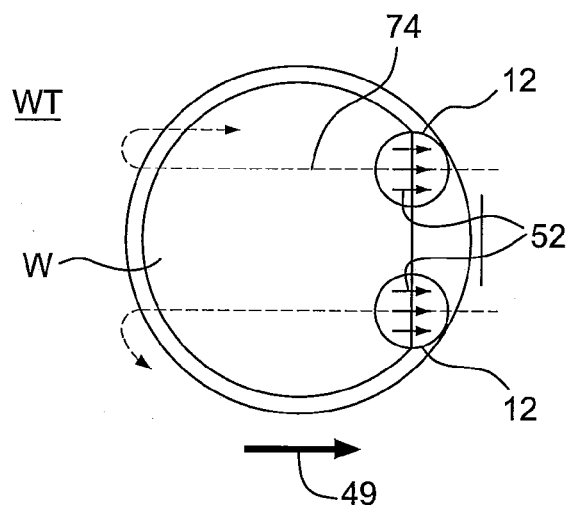
FIG. 13 is an embodiment of the present invention in which two adjacent paths cross the indentation in a substrate.

In an embodiment, for example, the flow 52 may be substantially parallel to the direction of relative motion 49 of the substrate table WT with respect to the projection system PS, and a substrate W with a large indentation is used (see FIG. 8*b*). In such a situation, referring to FIG. 13, there may be two adjacent scan paths 74 in which the indentation 40, 44 moves under the barrier member 12. In such a situation, the route may be modified to ensure that each scan path 74 over the indentation 40, 44 is in substantially the same direction. That is in each scan path 74 the indentation 40, 44 is downstream in the liquid flow 52 from the substrate W, as shown in FIG. 13.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided a method of operating a lithographic apparatus. The method comprises positioning a substrate having an edge feature on a substrate table; and providing a flow of the immersion liquid on the surface of the substrate. The edge feature is downstream of the substrate in the immersion liquid flow.

Positioning the substrate may comprise rotating the substrate by an angular displacement in response to a sensed position of the edge feature. Positioning the substrate may comprise sensing the position of the edge feature in the edge of a substrate. Positioning the substrate may comprise initiating a signal from a controller for operating a positioner on receipt of a signal from a sensor.

Providing a flow of the immersion liquid may comprise extracting in the liquid flow a bubble formed at the edge feature. Extracting the bubble in the liquid flow may be through a fluid outlet provided in the fluid handling structure or an outlet of a fluid extractor provided in a surface of the substrate table.

In providing the liquid flow, the liquid flow may be in the space and may be perpendicular to a direction of relative motion between the substrate table and the projection system.

In providing the liquid flow the liquid flow may be in the space and parallel to a direction of relative motion between the substrate table and the projection system.

In two adjacent scan paths that cross the edge feature, the edge feature may be downstream in the liquid flow from the substrate.

In an embodiment, there is provided an immersion lithographic apparatus, comprising a substrate table, a projection system, a fluid handling system and a positioner. The substrate table is constructed and arranged to hold a substrate. The substrate has an edge feature. The projection system is configured to project a patterned beam of radiation onto the substrate. The fluid handling system is constructed and arranged to supply a liquid flow to a space between the projection system and the substrate table and to at least partly confine the liquid to the space. The positioner is configured to position the substrate on the substrate table so that the edge feature lies downstream of the substrate in the liquid flow. The positioner may comprise a substrate handler constructed and arranged to handle a substrate. The substrate handler may be configured to rotate the substrate, wherein the angular displacement of the substrate is controlled in response to a signal for operating the positioner. The angular displacement of the substrate may be determined relative to a sensed position of the edge feature. The positioner may comprise a sensor constructed and arranged to sense the position of the edge feature in the edge of a substrate. The positioner may comprise a controller in signal communication with the sensor, the controller configured to initiate a signal for operating the positioner on receipt of a signal from the sensor.

The fluid handling system may comprise a fluid outlet, the fluid outlet being constructed and arranged to extract in the liquid flow a bubble formed at the edge feature.

The surface of the substrate table may be provided with a fluid extractor outlet, the fluid extractor outlet being constructed and arranged in use to extract in the liquid flow a bubble formed at the edge feature.

The substrate table may comprise a substrate holder configured to receive a substrate and the fluid extractor outlet may be in at or near the edge of the substrate holder. A recess may be formed in the surface of the substrate table, and the recess is shaped to receive the substrate, so that the top surfaces of the substrate and the substrate table are co-planar.

The liquid flow in the space may be perpendicular to a direction of relative motion between the substrate table and the projection system.

The liquid flow in the space may be parallel to a direction of relative motion between the substrate table and the projection system.

In an embodiment, the immersion lithographic apparatus may further comprise a motion controller, wherein the controller is constructed and arranged to control the relative direction of motion of the substrate table and the projection system, the speed of the liquid flow or the direction of liquid flow relative to the relative motion between the projection system and the substrate table or a combination of these options. The controller may be constructed and arranged so that in two adjacent scan paths the edge feature is downstream in the liquid flow from the substrate.

The edge feature may be an indentation in the edge of the substrate.

In an embodiment, there is provided an immersion lithographic apparatus, comprising a substrate table configured to hold a substrate, the substrate having a positioning feature; a fluid handling system configured to supply an immersion liquid flow on the substrate table; and a positioner configured to position the substrate on the substrate table so that, in use, the positioning feature is downstream in the immersion liquid flow relative to the substrate.

In an embodiment, there is provided a method of operating a lithographic apparatus or a metrology device, the method comprising: positioning a substrate having a positioning feature on a substrate table so that in an immersion liquid flow the positioning feature is downstream in the flow relative to the substrate; and providing the flow of the immersion liquid on the surface of the substrate.

In an embodiment, there is provided a metrology tool 200 comprising: a substrate table WT configured to hold a substrate, the substrate having a positioning feature; a fluid handling system or liquid supply system with barrier member 12, IH configured to supply an immersion liquid flow on the substrate table WT; and a positioner configured to position the substrate on the substrate table WT so that, in use, the positioning feature is downstream in the immersion liquid flow relative to the substrate.

In an embodiment, there is provided a computer program which when operated on a computer in signal communication with a lithographic apparatus causes the computer to operate the lithographic apparatus.

The descriptions above are intended to be illustrative, not limiting. Thus, it will be apparent to one skilled in the art that modifications may be made to the invention as described without departing from the scope of the claims set out below.

The invention claimed is:

1. A method of operating a lithographic apparatus, the method comprising:

positioning a substrate having an edge feature on a substrate table, the edge feature comprising an indentation in the edge of the substrate or a flat portion of an otherwise circular edge of the substrate, the positioning comprising rotating the substrate by an angular displacement in response to a sensed position of the edge feature so that the edge feature becomes, downstream of the substrate, in a flow of immersion liquid; and providing the flow of the immersion liquid on the surface of the substrate.

2. The method of claim 1, wherein positioning the substrate comprises sensing the position of the edge feature in the edge of a substrate.

3. The method of claim 1, wherein in providing a flow of the immersion liquid, extracting in the liquid flow a bubble formed at the edge feature, wherein extracting the bubble in the liquid flow is through a fluid outlet provided in the fluid handling structure or an outlet of a fluid extractor provided in a surface of the substrate table.

4. The method of claim 1, wherein in two adjacent scan paths that cross the edge feature, the edge feature is, downstream from the substrate, in the liquid flow.

5. An immersion lithographic apparatus, comprising:

a substrate table constructed and arranged to hold a substrate, the substrate having an edge feature, the edge feature comprising an indentation in the edge of the substrate or a flat portion of an otherwise circular edge of the substrate;

a projection system configured to project a patterned beam of radiation onto the substrate;

a fluid handling system constructed and arranged to supply a liquid flow to a space between the projection system and the substrate table and to at least partly confine the liquid to the space; and a positioner configured to position the substrate on the substrate table so that the edge feature lies, downstream of the substrate, in the liquid flow, the positioner configured to rotate the substrate by an angular displacement in response to a sensed position of the edge feature so that the edge feature becomes, downstream of the substrate, in the liquid flow.

6. The immersion lithographic apparatus of claim 5, wherein the positioner comprises a substrate handler constructed and arranged to handle a substrate.

7. The immersion lithographic apparatus of claim 6, the substrate handler being configured to rotate the substrate, the angular displacement of the substrate being controlled in response to a signal for operating the positioner.

8. The immersion lithographic apparatus of claim 5, wherein the positioner comprises a sensor constructed and arranged to sense the position of the edge feature in the edge of a substrate.

9. The immersion lithographic apparatus of claim 8, wherein the positioner comprises a controller in signal communication with the sensor, the controller configured to initiate a signal for operating the positioner on receipt of a signal from the sensor.

10. The immersion lithographic apparatus of claim 5, wherein the fluid handling structure comprises a fluid outlet, the fluid outlet being constructed and arranged to extract, in the liquid flow, a bubble formed at the edge feature.

11. The immersion lithographic apparatus of claim 5, wherein a surface of the substrate table is provided with a fluid extractor outlet, the fluid extractor outlet being constructed and arranged in use to extract, in the liquid flow, a bubble formed at the edge feature.

12. The immersion lithographic apparatus of claim 11, wherein the substrate table comprises a substrate holder configured to receive a substrate and the fluid extractor outlet is formed in at or near the edge of the substrate holder.

13. The immersion lithographic apparatus of claim 5, wherein a recess is formed in the surface of the substrate table, and the recess is shaped to receive the substrate, so that the top surfaces of the substrate and the substrate table are co-planar.

14. The immersion lithographic apparatus of claim 5, wherein the liquid flow in the space is perpendicular to a direction of relative motion between the substrate table and the projection system.

15. The immersion lithographic apparatus of claim 5, wherein the liquid flow in the space is parallel to a direction of relative motion between the substrate table and the projection system.

16. A non-transitory computer readable storage medium, having a computer program which when operated on a computer in signal communication with a lithographic apparatus causes the computer to operate the lithographic apparatus to carry out a method, the method comprising:

positioning a substrate having an edge feature so that in an immersion liquid flow the edge feature is, downstream of the substrate, in the immersion liquid flow, the edge feature comprising an indentation in the edge of the substrate or a flat portion of an otherwise circular edge of the substrate, the positioning comprising rotating the substrate by an angular displacement in response to a sensed position of the edge feature so that the edge feature becomes, downstream of the substrate, in the immersion liquid flow; and providing the flow of the immersion liquid on the surface of the substrate.

17. A metrology tool comprising:

a substrate table configured to hold a substrate, the substrate having an edge feature, the edge feature comprising an indentation in the edge of the substrate or a flat portion of an otherwise circular edge of the substrate;

a fluid handling system configured to supply an immersion liquid flow on the substrate table; and a positioner configured to position the substrate on the substrate table so that, in use, the edge feature lies, downstream of the substrate, in the immersion liquid flow, the positioner configured to rotate the substrate by an angular displacement in response to a sensed position of the edge feature so that the edge feature becomes, downstream of the substrate, in the liquid flow.

18. A method, comprising:

providing a flow of immersion liquid on the surface of a lithographic substrate, the substrate having an edge feature, the edge feature comprising an indentation in the edge of the substrate or a flat portion of an otherwise circular edge of the substrate; and rotating the substrate by an angular displacement in response to a sensed position of the edge feature so that the edge feature is, downstream of the substrate, in the immersion liquid flow.

19. The method of claim 18, wherein in two adjacent scan paths that cross the edge feature, the edge feature is, downstream from the substrate, in the liquid flow.

* * * * *